Jan. 30, 1968 M. D. BEAR ET AL 3,366,805

SEMICONDUCTOR DIODE MICROWAVE PULSE GENERATOR

Filed May 3, 1965 2 Sheets-Sheet 1

INVENTORS
MARSHALL D. BEAR
HELMUTH H. LAUE
BY ROBERT R. APGAR JR.
Carl R. Brown
ATTORNEY

INVENTORS
MARSHALL D. BEAR
HELMUTH H. LAUE
BY ROBERT R. APGAR JR.

Carl R. Brown
ATTORNEY

United States Patent Office 3,366,805
Patented Jan. 30, 1968

3,366,805
SEMICONDUCTOR DIODE MICROWAVE PULSE GENERATOR

Marshall D. Bear, 2656 Wyandotte, San Diego, Calif. 92117; Helmuth H. Laue, 1125 Highland Drive, R.R. 1, Box 154, Solona Beach, Calif. 92075; and Robert R. Apgar, Jr., 5026 College Gardens Court, San Diego, Calif. 92115

Filed May 3, 1965, Ser. No. 452,488
8 Claims. (Cl. 307—261)

ABSTRACT OF THE DISCLOSURE

This invention concerns apparatus for generating microwave pulses by applying reverse bias voltage pulses to a semiconductor diode, which voltage pulses exceed the breakdown voltage of the diode.

The generation of radio frequency signals in the microwave region has been accomplished for many years by the use of microwave oscillator tubes such as klystron, magnetron and backward wave oscillators. While these tubes can be operated in either the continuous wave or pulse wave mode, satisfactory operation in the pulse wave mode has in general been restricted to pulse durations of 100 nanoseconds or longer. Additionally, these tubes are expensive, complex and consume considerable heater power as well as requiring high operating voltages. Further, the large weight and size of these tubes make them unsuitable for many applications where smaller and lighter microwave generators are required.

For applications requiring only modest power levels, solid state harmonic generator devices are in common use in the microwave field. Many of the disadvantages associated with the microwave oscillator tubes are eliminated by the use of these devices. Harmonic generators known to the art generally consist of a non-linear element, driven by a fundamental frequency signal to produce many harmonics. The harmonic generators permit the fundamental drive frequency signal to be generated at a low frequency where sufficient power can be efficiently obtained and then the drive frequency signal is converted to the desired frequency by the harmonic generator.

Present day solid state harmonic generators generally employ a variable reactance diode, commonly called a varactor, as the non-linear element. The varactor exhibits a non-linear capacitance variation useful in harmonic generators when receiving an applied bias voltage in the region between a given level of the varactors forward voltage conduction and the varactors reverse breakdown voltage. In this application the varactor exhibits highest efficiency when used as a variable capacitance diode, that is when its operation is restricted to voltage changes between the two aforesaid voltages. This is a region of low current flow.

In addition to the non-linear capacity diode harmonic generator, a step recovery diode is sometimes used to generate high order harmonics. The step recovery diode is a silicon P-N junction diode. Unlike the operation of the non-linear capacity varactor diode harmonic generator, the bias on the step recovery diode is adjusted to permit current conduction during positive portions of the fundamental driving frequency signal. During such forward conduction, a charge is stored in the diode by the minority carriers. Upon application of a reverse bias voltage as during the negative portion of the fundamental driving frequency signal, the stored charge flows out of the diode as reverse current. During the initial phase of reverse recovery, the conductivity of the diode will remain essentially the same as its forward conduction value, and the impedance of the diode therefore remains low during this interval. The reverse current ceases to flow when the stored minority carriers have been depleted by the flow of reverse current. This causes an abrupt transition or "step" in the reverse recovery wave form. Upon completion of this rapid transition time, the RF impedance of the diode becomes that of the reverse bias diode capacitance. The harmonic spectrum that is thus generated by the step recovery action depends upon the cut-off speed and the characteristics of the circuit within which the diode is imbedded. To the extent that each excitation cycle produces the same wave train as the preceding one, the resulting wave can be completely expressed in terms of a harmonic spectrum related to the excitation frequency. In practice, the step recovery diode can be operated in a circuit similar to that which uses the varactor diode, if the bias is properly adjusted.

"Step recovery" cannot occur if the diode is operated past the reverse voltage breakdown point. Hence, the amplitude of the fundamental driving frequency signal and the bias must be so adjusted to restrict operation to the same voltage region as that used by the varactor diode harmonic generator.

Admittedly, prior art solid state harmonic generators represent a considerable improvement over the vacuum tube harmonic generator for applications requiring modest power levels.

With an appreciation of the foregoing prior art devices for generating microwave energy, it is therefore an object of this invention to provide an improved and novel method and apparatus for generating microwaves.

It is another object of this invention to provide an improved and novel apparatus for using a solid state source for generating radio frequency pulsed power that can be placed anywhere in the microwave spectrum.

It is another object of this invention to provide an improved and novel apparatus for generating fractional-nanosecond microwave pulses of medium power level that are simple, efficient and small in size and weight.

It is another object of this invention to provide an improved and novel generation of microwave pulses that are readily amplified by broadband amplifiers such as traveling wave tubes, tunnel diodes and the like.

It is still another object of this invention to provide an improved and novel apparatus for generating microwave pulses that is reliable and lends to microminiaturization.

The apparatus of this invention generates a high impulse current for creating microwaves by the combined action of a fast rise short pulse and a diode exhibiting a fast reverse voltage breakdown characteristic. The fast-rise pulse, that may be in the order of 0.5 nanosecond or less, preferably has an amplitude in the order of 1 to 3 times the level of the reverse breakdown voltage of the fast semiconductor diode. The pulse is launched down a coaxial cable to the diode that essentially is across the coaxial cable. The pulse's leading edge applies a fast-rising reverse voltage across the diode; so fast that the diode doesn't break down until the rising voltage is well past the level of the normal reverse voltage breakdown for the diode. When the diode breaks down, a maximum short circuit current flows in the section of the coaxial cable containing the pulse and terminating diode. The short circuit current flowing through the diode and the terminals holding the diode, when encased in a bounded space that can support any of the principle electro-magnetic modes, will excite and impart electromagnetic energy in the form of a short burst of microwave energy. Peak power greater than 10 watts in the X-band region has been generated by this method.

Other objects, features and advantages of the invention will become apparent, and a better understanding of the construction and operation of the invention will be had from the following detailed description taken in conjunction with the accompanying drawings wherein.

Figures 1, 2, 3, 4:
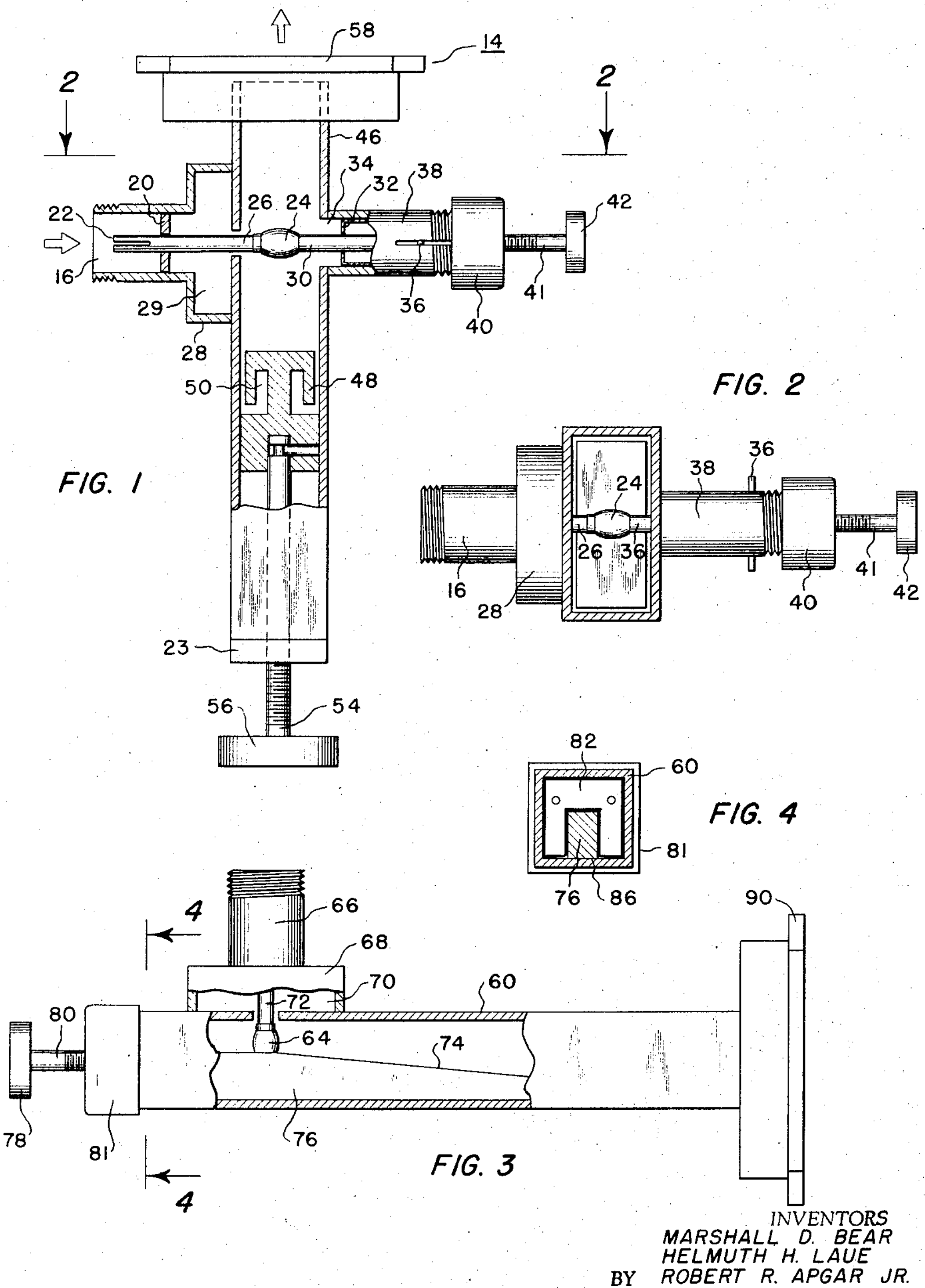
FIGURE 1 is a side view partly in section of a microwave generator and waveguide of this invention.
FIGURE 2 is a view partly in section taken along lines 2—2 of FIGURE 1.
FIGURE 3 is a side view partly in section of a modified microwave generating apparatus of this invention.
FIGURE 4 is a view taken along lines 4—4 of FIGURE 3.

Referring now to FIGURE 1 there is shown a microwave generator and wave guide for generating microwaves in the $TE_{10}$ mode. A flange 58 passes the microwave output therethrough and thus is capable of conventional connection to a microwave structure for continued launching and propagation of the microwave pulses generated. A normal coaxial connection is made with threaded member 16 to provide the fast rise input pulse to the diode 24. The central conductor of the coaxial member (not shown) makes contact with the inner conductor 22 in the normal manner. Insulator insert 20 physically stabilizes the inner conductor 22 and prevents direct electrical contact with the outer coaxial conductor 16. Conductor 22 may slidably move within the insulator 20.

The waveguide structure 14 may be constructed from any suitable metallic materials. A conductor mount is provided for positioning the semi-conductor diode 24 relative to the waveguide structure. Also the waveguide structure includes means for phasing the reflected voltage pulse, an adjustable waveguide shorting device 48 and microwave trap 28.

The diode 24 is rigidly secured to conductors 26 and 30 with circuit resistance reduced as low as possible. Conductor 30 passes through opening 34 and is integral with rod 41 on which knob 42 is mounted. Knob 42 may be grasped and rod 41 slidably moved through collar 40 and through opening 34 permitting adjustable positioning of the diode 24 relative to the inner cavity of the wave guide and the microwave trap 28. The device for tuning the reflected voltage pulse comprises a flange that substantially fills the opening 34 between rod 30 and the outer housing member 38. Blocking member 32 may be moved in opening 34 along the length of rod 30. Diode 24 may be moved by rod 30 without causing concurrent movement of the tuning device 32.

The adjustable waveguide short 48 comprises a piston member 48 having a diameter that substantially fills the inner space of the wave guide. The piston 48 is adjustably positioned by rod 54 and turning knob 56. Recess 50 provides an additional microwave trap. The recessed or expanded volume 29 provides a microwave trap for preventing microwaves generated by diode 24 from passing down the input coaxial conductor.

Figure 6:
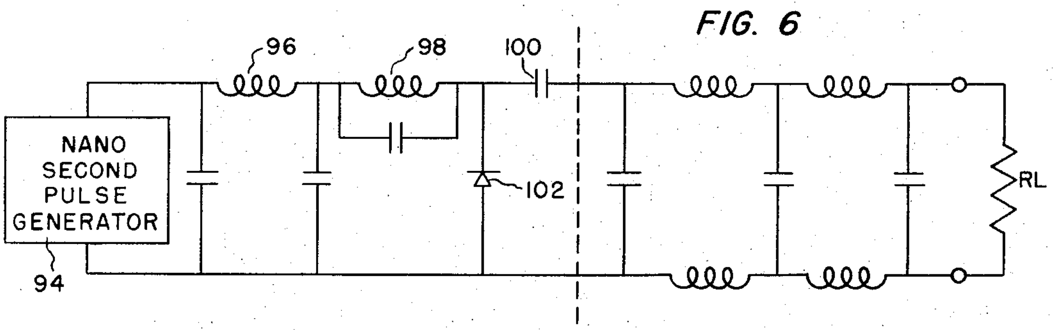
FIGURE 6 is a graph of the equivalent circuit of the embodiments of this invention.
Figure 7:
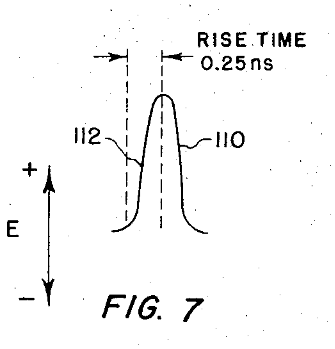
FIGURE 7 is a graph of the waveform of the voltage pulse that drives the diode in this invention.

Referring now to FIGURE 6 there is shown an equivalent diagram of the general circuit of this invention. A nanosecond pulse generator 94 generates very short in time pulses that are carried by the coaxial cable to the microwave generator of FIGURES 1 and 3. The capacitance and inductance 96 represents that impedance in the coaxial cable. The parallel capacitive inductive circuit 98 represents the microwave trap and the semiconductor 102 across the circuit is diode 24 of FIGURE 1 and 64 of FIGURE 3. Capacitance 100 represents the capacitance of the microwave by-pass. The circuit beyond the dotted lines 104 represents the RF output circuit now shown with RL being the output load. FIGURE 7 represents the wave form of the fast rise time nanosecond pulse generated by the nanosecond pulse generator 94.

Figure 5:
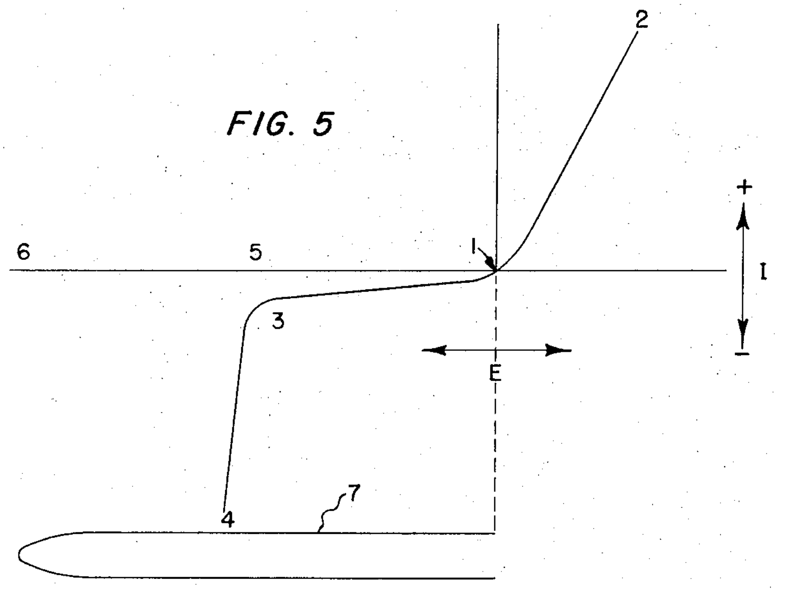
FIGURE 5 is a graph of the voltage current characteristics of a semiconductor diode.

Referring now to FIGURE 5 there is shown a typical voltage-current curve for a semiconductor junction diode. When voltage is applied in the forward direction or from 1 to 2, the current varies as shown by the solid line curve. It may be seen that only a few volts are required to cause a large magnitude current flow. Further increase in forward voltage causes a current rise that is almost linear in relationship to the applied voltage and the maximum rated current is reached before a very large voltage is applied. However, when voltage is applied in the reverse direction then the current varies as shown by the solid line curve 1 to 3. Large increases in reverse voltage cause only a very small rise in current. In fact the current is so low that the current shown in the diagram is larger than that which would actually flow. The extremely small current flow is due to the fact that there are very few current carriers under reverse biased direction, and once all these current carriers are flowing a state of saturation takes place.

Figure 8:
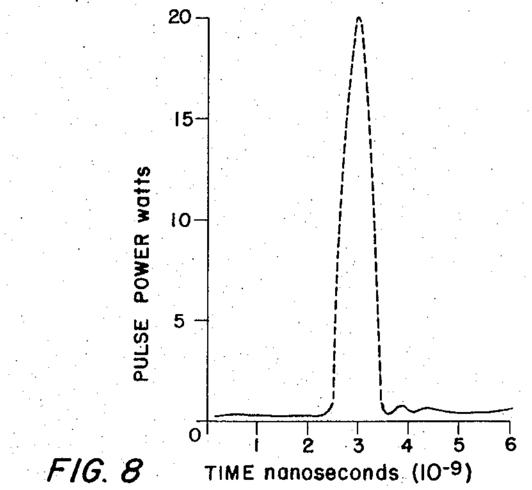
FIGURE 8 is a graph of the detected envelope of a microwave pulse generated by this invention.

This state of saturation does not continue indefinitely as the reverse voltage is increased. As higher reverse voltages are applied, more current begins to flow. Eventually a condition is reached where the diode resistance drops very rapidly, and a very large reverse current increase 3–4 takes place with substantially no further increase in reverse voltage. The reverse voltage at which this effect takes place is called the reverse voltage breakdown. While damage to the diode can occur by holding the reverse voltage at the breakdown voltage for a period of time, this damage can be prevented by conducting away the heat generated and by rapidly decreasing the reverse voltage. Voltage wave 7 represents the voltage of the voltage wave 110 of FIGURE 7 that is generated by the pulse generator 94. In the invention, the large current that flows in the diode as a result of breakdown voltage of the diode being exceeded, initiates electronic waves in the waveguide that propagate, thereby generating a plurality of RF cycles that make up the microwave pulse. The detected envelope of the microwave pulse is shown in FIGURE 8.

In operation, the pulse generator 94 generates a pulse having a rise time in the order of 0.5 nanosecond and having a voltage peak that exceeds the reverse breakdown voltage of the diode 24 by approximately one to three times. Point 112 of the pulse 110 in FIGURE 7 identifies approximately the level of the reverse breakdown voltage of the diode. The voltage level rises so fast that the diode doesn't breakdown until the rising voltage is past the normal breakdown voltage level. This over voltage condition increases the speed of breakdown or avalanche. When the diode does breakdown, a maximum short circuit current flows in the section of the cable containing the pulse and diode at that instant of time. This short circuit current flowing through the diode when encased in a confined space such as the waveguide shown in FIGURE 1, in a $TE_{10}$ mode, excites and imparts electromagnetic energy in the form of a short burst of microwave energy. This burst of microwave energy will occur for each nanosecond pulse applied to the semiconductor diode 24.

The large current charges passes at a high velocity across the magnetic lines of the $TE_{10}$ wave mode in the guide. This current initiates an electromagnetic wave in the waveguide 14 that propagates in both directions. In one direction the waves move out the RF output and in the opposite direction the waves move toward the waveguide short 48 where the waves are immediately reflected in a manner that they add vectorically to the original wave. The shorting stub 48 is correctly positioned to the desired fractional wave length to effect this in phase adding of the microwave energy. Also the diode experiences a reflected voltage pulse that generates additional electromagnetic waves in the waveguide. This additional electromagnetic wave energy is also tuned to add to the microwave energy passing out the RF output by correctly tuning or positioning the reflected voltage pulse tuning device 32. The microwave energy that attempts to move out through the coaxial cable is rejected by the microwave trap 28. Knob 42 is moved to correctly position the diode 24 and its junction 26 relative to the microwave trap 28.

The Q of the microwave generators in FIGURES 1 and 3 may be so designed and adjusted to be sufficient (by low losses) to allow several transfers of the magnetic and electric energy. Thus a large amplitude decaying microwave may be generated having the nominal frequency of the waveguide structure including the waveguide and semiconductor appurtenances. It is, of course, necessary and desirable to reduce the microwave power loss such as by use of the microwave trap 28 shown in FIGURES 1 and 3. It is also necessary and desirable to minimize the resistance loss in the semiconductor and the connection to the mounting rods 26 and 30. In addition it is important in the waveguides of FIGURES 1 and 3 that no part of the waveguide circuit be allowed to support any other mode than the principle waveguide mode of $TE_{10}$.

Referring to FIGURE 3, the diode 64 is fixed on one end directly to the large conductor member 74 that is fixed to the surface 86 of the waveguide in the manner shown. This mounting functions to reduce the resistance in the diode circuit and also substantially eliminates any reflected voltage effects and the necessity of tuning the microwave energy generated by such pulses. The waveguide short shown in FIGURE 3 comprises knob 78 for pushing rod 80 that is connected to a flange 82. The flange or plate 82 is notched for fitting within the cavity of the guide member 60 and around the outer rectangular surface of the longitudinal member 76.

As previously stated several cycles of microwave energy are generated in the waveguide for each nanosecond pulse impressed upon the diode. These cycles of microwave energy, while not in themselves capable of being readily displayed with present state of the art displaying equipment, form a composite microwave pulse, when detected, of the power and time duration as shown in FIGURE 8. Peak power greater than ten watts in the X-band region has been generated by the method of this invention. This novel source of microwave energy is sufficient for direct use and the output microwave pulses are clearly defined and repeatable. Efficiencies as high as approximately ten percent and with possibilities as high as thirty to fifty percent are obtainable by using the method and apparatus of this invention. As a general design factor when the microwave structure is designed or adjusted for a low Q then a sharp short pulse such as shown in FIGURE 8 occurs. With a low Q there will be a restriction in the ringing of the circuit and accordingly broader band of the frequency spectrum may be projected. On the other hand, if designed for a high Q, then there will be more ringing and thus longer pulses and a narrower frequency band projected.

While any semiconductor type diode may be used effectively in this invention, PN type diodes and PIN junction diodes have proven very effective. It is thought possible that any diode capable of generating a large substantially instantaneous current pulse as a result of receiving a voltage greater than its reverse breakdown potential, may be used effectively in this invention. The particular diode efficiency however depends upon the speed of breakdown and the internal resistance of the diode after breakdown. In general, the higher the diode reverse breakdown voltage, the greater the impulse current and consequently the greater the electromagnetic mircowave energy generated. Also the smaller the package (diode, minimum capacitance, series resistance and inductance), the more efficiently that the diode will operate. In repeatably pulsing the diode, the entire reverse voltage pulse is in the nanosecond region or less. Thus it is possible to prevent diode burn out even though there is repeated reverse pulsing of the diode beyond its breakdown voltage level. Of course, since only the leading edge of the applied voltage is used to create the high current impulse, after complete diode breakdown has occurred, a portion of the voltage pulse extending past this time can be considered to be superfluous and can be eliminated so as not to be detrimental and destroy the diode.

In using this invention, sub-nanosecond RF pulses have been successfully generated and recorded in the C, X and KU band regions. Peak power levels of 15 to 20 watts have been generated. Further, RF pulses generated have been in the sub-nanosecond region with pulses in the X band recorded that have time durations of less than .25 nanosecond at the 3 db point. The spectral components of the microwave pulse envelope generated lend to amplification through broad band amplifiers. In one specific test it was found that at X band, the frequency components contained within the microwave pulses ranged from approximately 8 to 11.5 K mc./s. at the half power point.

Although the invention has been described relative to specific embodiments, it is understood that its advantages can be realized in other forms. It is our intention therefore that the invention not be limited to what has been shown and described except as such limitation appears in the appended claims.

We claim:

1. A microwave pulse source for generating repeatable microwave pulses comprising,
waveguide means for launching and propagating microwave pulses,
semiconductor diode means positioned in said waveguide for generating microwave energy,
and means for applying a plurality of short duration voltage pulses having fast rise times to said semiconductor diode with each pulse having a magnitude exceeding the reverse breakdown voltage of said diode.

2. A microwave pulse source comprising,
a semiconductor diode mounted in a waveguide,
means for serially applying a video voltage pulse across said diode,
and the voltage magnitude of said video pulse exceeding the reverse breakdown voltage of said diode.

3. A mocrowave pulse source for generating useful and repeatable microwaves comprising,
a semiconductor diode mounted in a waveguide,
means for applying a controlled video nanosecond pulse across said diode,
and the voltage of said video pulse exceeding the reverse breakdown voltage of said diode.

4. A microwave pulse source for generating repeatable mocrowave comprising,
waveguide means for launching and propagating microwaves,
semiconductor diode means mounted in said waveguide for generating microwaves,
means for applying a controlled reverse bias video nanosecond pulse across said diode,
and the peak voltage of said video pulse being more than twice the reverse breakdown voltage of said diode.

5. A mocrowave pulse source for generating useful microwave energy comprising,
microwave structure for launching and propagating microwaves,
said microwave structure having a waveguide,
a semiconductor diode means mounted coaxially in and broadside to said waveguide for generating microwaves,
coaxial line means for applying a controlled video nanosecond pulse across said diode,
and the peak voltage of said video pulse being at least twice the reverse breakdown voltage of said diode causing a high impulse current to flow in said diode.

6. A microwave pulse source for generating useful microwave energy comprising, microwave structure for launching and propagating microwaves, said microwave structure having a waveguide, semiconductor diode means mounted coaxially in and broadside to said waveguide for generating microwaves, coaxial line means for applying a controlled video nanosecond pulse across said diode, the peak voltage of said video pulse exceeding the reverse breakdown voltage of said diode causing a high impulse current to flow in said diode, microwave trap means for preventing loss of microwave energy without degrading said nanosecond pulse, and shorted line means in said microwave structure for applying reflected microwaves generated by said high impulse current in said diode to reinforce said microwave energy.

7. A mocrowave pulse source for generating useful microwave energy comprising, microwave structure for launching and propagating microwaves, said microwave structure having a waveguide, semiconductor diode means mounted coaxially in and broadside to said waveguide for generating microwaves, coaxial line means for applying a controlled video nanosecond pulse across said diode, the peak voltage of said video pulse exceeding the reverse breakdown voltage of said diode causing a high impulse current to flow in said diode and the generation of a reflected voltage pulse, and adjustable means for phasing the reflected voltage pulse in a manner that the mircowave energy created by said reflected voltage pulse reinforces said microwave pulses.

8. A microwave pulse source for generating repeatable microwave energy comprising, microwave structure for launching and propagating microwaves, said microwave structure having a waveguide, semiconductor diode means mounted coaxially in and broadside to said waveguide for generating microwaves, coaxial line means for applying a controlled video nanosecond pulse across said diode, the peak voltage of said video pulse exceeding the reverse breakdown voltage of said diode causing a high impulse current in said diode, microwave trap means positioned around the coaxial imput conductor for preventing loss of microwave energy without degrading said nanosecond pulse, shorted line means positioned normal to said coaxial imput conductor for applying reflected microwaves generated by said high impulse current in said diode to reinforce said microwave energy, and adjustable means for phasing the reflected voltage pulse in a manner that the microwave energy created by said reflected voltage pulse reinforces said microwave pulses.

References Cited

UNITED STATES PATENTS

| | | | |
|---|---|---|---|
| 3,014,188 | 1/1961 | Chester et al. | 333—83 |
| 3,060,365 | 10/1962 | Crandell | 331—76 X |
| 3,136,963 | 6/1964 | Feldman et al. | 333—7 |
| 3,270,293 | 8/1966 | Loach et al. | 331—107 |

JOHN S. HEYMAN, *Primary Examiner.*

ARTHUR GAUSS, *Examiner.*

S. D. MILLER, *Assistant Examiner.*